(12) United States Patent
Stephenson et al.

(10) Patent No.: US 10,777,451 B2
(45) Date of Patent: Sep. 15, 2020

(54) SEMICONDUCTOR DEVICE INCLUDING ENHANCED CONTACT STRUCTURES HAVING A SUPERLATTICE

(71) Applicant: ATOMERA INCORPORATED, Los Gatos, CA (US)

(72) Inventors: Robert John Stephenson, Duxford (GB); Richard Burton, Phoenix, AZ (US); Dmitri Choutov, Sunnyvale, CA (US); Nyles Wynn Cody, Tempe, AZ (US); Daniel Connelly, San Francisco, CA (US); Robert J Mears, Wellesley, MA (US); Erwin Trautmann, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 16/296,414

(22) Filed: Mar. 8, 2019

(65) Prior Publication Data
US 2019/0280090 A1    Sep. 12, 2019

Related U.S. Application Data

(60) Provisional application No. 62/640,392, filed on Mar. 8, 2018.

(51) Int. Cl.
*H01L 29/15* (2006.01)
*H01L 21/768* (2006.01)
(Continued)

(52) U.S. Cl.
CPC .... *H01L 21/76831* (2013.01); *H01L 21/0245* (2013.01); *H01L 21/02507* (2013.01);
(Continued)

(58) Field of Classification Search
CPC .... H01L 29/151; H01L 29/157; H01L 29/152
See application file for complete search history.

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 |
| WO | 2007131117 | 11/2007 |

OTHER PUBLICATIONS

U.S. Appl. No. 15/842,981, filed Dec. 15, 2017 Chen et al.
(Continued)

*Primary Examiner* — Grant S Withers
(74) *Attorney, Agent, or Firm* — Allen, Dyer, Doppelt + Gilchrist, P.A.

(57) ABSTRACT

A semiconductor device may include a semiconductor substrate having a trench therein, and a superlattice liner at least partially covering bottom and sidewall portions of the trench. The superlattice liner may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. The semiconductor device may further include a semiconductor cap layer on the superlattice liner and having a dopant constrained therein by the superlattice liner, and a conductive body within the trench.

27 Claims, 11 Drawing Sheets

(51) Int. Cl.
*H01L 21/02* (2006.01)
*H01L 21/285* (2006.01)
*H01L 29/08* (2006.01)
*H01L 29/417* (2006.01)
*H01L 29/45* (2006.01)
*H01L 23/485* (2006.01)

(52) U.S. Cl.
CPC .. *H01L 21/28518* (2013.01); *H01L 21/28525* (2013.01); *H01L 21/76832* (2013.01); *H01L 21/76859* (2013.01); *H01L 21/76864* (2013.01); *H01L 23/485* (2013.01); *H01L 29/0843* (2013.01); *H01L 29/151* (2013.01); *H01L 29/152* (2013.01); *H01L 29/41766* (2013.01); *H01L 29/456* (2013.01)

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,447,933 B1 | 9/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,402,512 B2 | 7/2008 | Derraa et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Hatilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 2003/0034529 A1 | 2/2003 | Fitzgerald et al. |
| 2003/0057416 A1 | 3/2003 | Currie et al. |
| 2006/0220118 A1* | 10/2006 | Stephenson ............ B82Y 10/00 257/336 |
| 2006/0267130 A1 | 11/2006 | Rao |
| 2006/0273299 A1* | 12/2006 | Stephenson ............ B82Y 10/00 257/15 |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2011/0215299 A1 | 9/2011 | Rao |
| 2015/0357414 A1 | 12/2015 | Mears |
| 2016/0149023 A1 | 5/2016 | Mears et al. |
| 2016/0358773 A1 | 12/2016 | Mears et al. |
| 2018/0040724 A1 | 2/2018 | Mears et al. |
| 2018/0040725 A1 | 2/2018 | Mears et al. |
| 2018/0337063 A1 | 11/2018 | Takeuchi |
| 2018/0337064 A1 | 11/2018 | Takeuchi |
| 2018/0358361 A1 | 12/2018 | Rao |
| 2018/0358442 A1 | 12/2018 | Rao |
| 2019/0057896 A1 | 2/2019 | Stephenson et al. |
| 2019/0058059 A1 | 2/2019 | Stephenson et al. |

OTHER PUBLICATIONS

U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.
U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 16/117,178, filed Aug. 30, 2018 Weeks et al.
U.S. Appl. No. 16/117,202, filed Aug. 30, 2018 Weeks et al.
U.S. Appl. No. 16/176,005, filed Oct. 31, 2018 Weeks et al.
U.S. Appl. No. 16/192,897, filed Nov. 16, 2018 Connelly et al.
U.S. Appl. No. 16/192,911, filed Nov. 16, 2018 Takeuchi et al.
U.S. Appl. No. 16/192,923, filed Nov. 16, 2018 Takeuchi et al.
U.S. Appl. No. 16/192,930, filed Nov. 16, 2018 Takeuchi et al.
U.S. Appl. No. 16/192,941, filed Nov. 16, 2018 Takeuchi et al.
U.S. Appl. No. 16/192,959, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
U.S. Appl. No. 16/296,400, filed Mar. 8, 2019 Stephenson et al.
Luo et al., "Chemical Design of Direct-Gap Light-Emitting Silicon" published in Physical Review Letters, vol. 89, No. 7; Aug. 12, 2002; 4 pgs.

(56) References Cited

OTHER PUBLICATIONS

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Novikov et al. "Silicon-based Optoelectronics" 1999-2003, pp. 1-6.

R. Tsu Phenomena in silicon nanostructure device published online Sep. 6, 2000 by Applied Physics and Materials Science & Processing, pp. 391-402.

R. Tsu "Si Based Green ELD: Si-Oxygen Superlattice" wysiwyg://l/http://www3.interscience.wiley.com/cgi-bin/abstract/72512946/start: published online Jul. 21, 2000: 2 pgs. Abstract Only.

Xu et al. "Effectiveness of Quasi-confinement technology for improving P-chapel Si an Ge MOSSFET performance" Department of Electrical Engineering and Computer Science, University of California, Berkeley, 2012, pp. 2. mearstech.net; retrieved from internet Jan. 18, 2016.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al., "MOSFET performance and scalability enhancement by insertion of oxygen layers", Department of Electrical Engineering and Computer Science, University of California, Berkeley, 2012, pp. 1-4.

\* cited by examiner

SEMICONDUCTOR DEVICE INCLUDING ENHANCED CONTACT STRUCTURES HAVING A SUPERLATTICE

CROSS-REFERENCE TO RELATED APPLICATIONS

The application claims the benefit of provisional application Ser. No. 62/640,392 filed Mar. 8, 2018, which is hereby incorporated herein in its entirety by reference.

TECHNICAL FIELD

The present disclosure generally relates to semiconductor devices and, more particularly, to semiconductor devices with enhanced contact structures and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor processing techniques in certain applications.

SUMMARY

A semiconductor device may include a semiconductor substrate having a trench therein, and a superlattice liner at least partially covering bottom and sidewall portions of the trench. The superlattice liner may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The semiconductor device may further include a semiconductor cap layer on the superlattice liner and comprising a dopant constrained therein by the superlattice liner, and a conductive body within the trench.

The conductive body may include a metal liner adjacent the semiconductor cap layer and comprising a first metal, and a metal body adjacent the metal liner, filling the trench and comprising a second metal. Moreover, the conductive body may further comprise silicide. By way of example, the semiconductor cap layer may comprise silicon, the first metal may comprise at least one of titanium, cobalt and nickel, and the second metal may comprise tungsten.

In accordance with an example embodiment, the conductive body may define a source/drain contact. By way of example, the base semiconductor monolayers may comprise silicon, and the at least one non-semiconductor monolayer may comprise oxygen. Also by way of example, the dopant may comprise at least one of boron, arsenic, and phosphorus.

DETAILED DESCRIPTION

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of enhanced contact structures in planar and vertical semiconductor devices through the use of an enhanced semiconductor superlattice to advantageously constrain a contact dopant in the desired contact region. The enhanced semiconductor superlattice is also referred to as an "MST" layer or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 1:
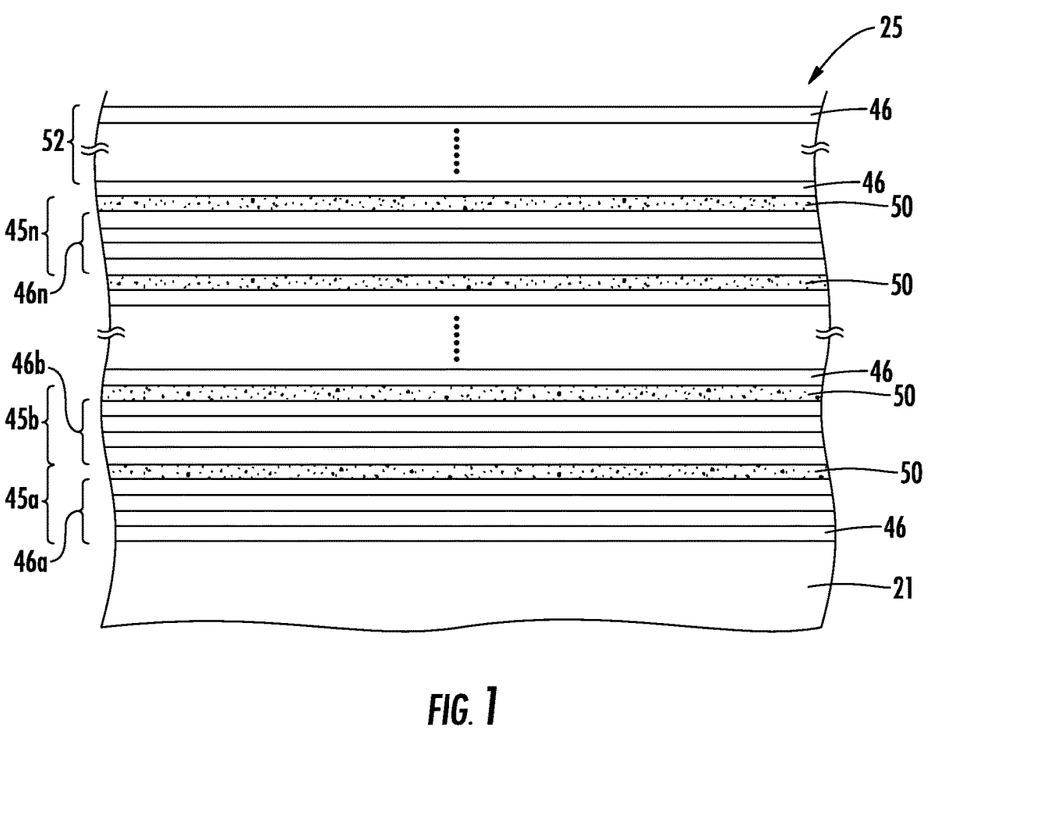
FIG. 1 is a greatly enlarged schematic cross-sectional view of a superlattice for use in a semiconductor device in accordance with an example embodiment.
Figure 2:
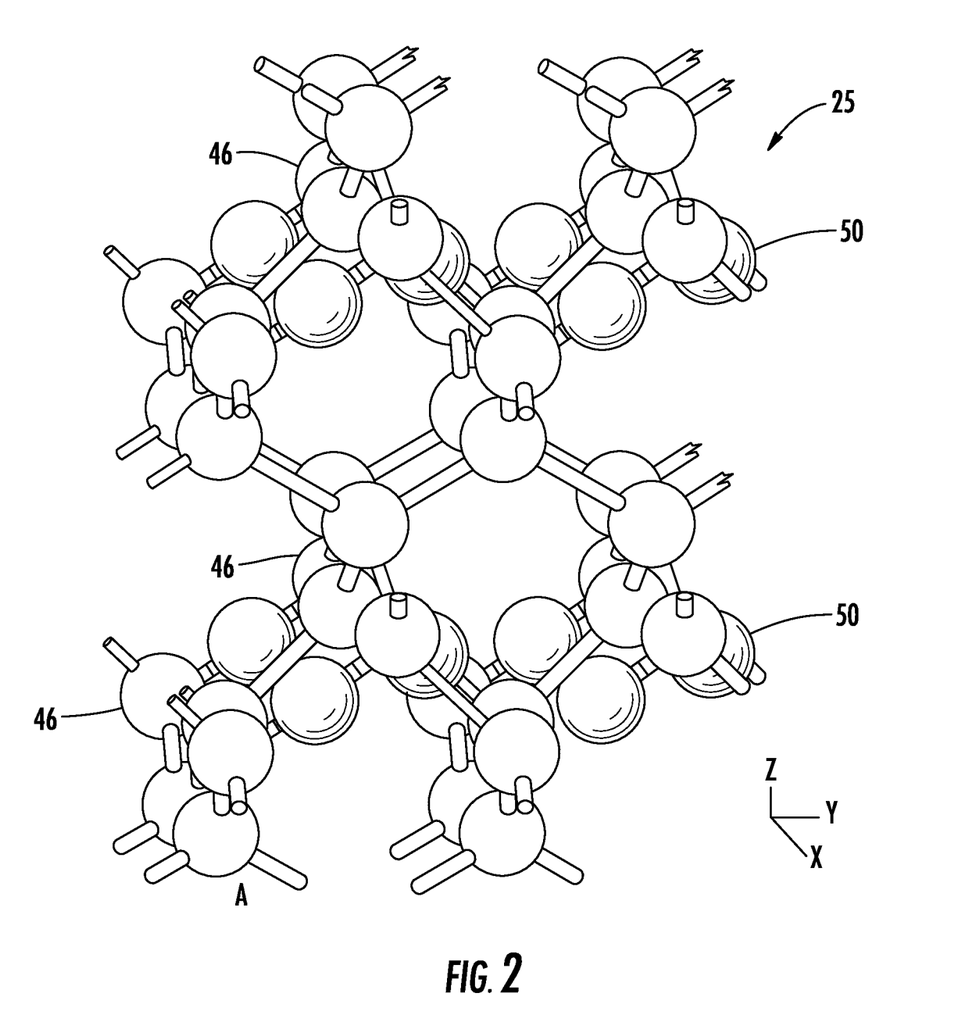
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
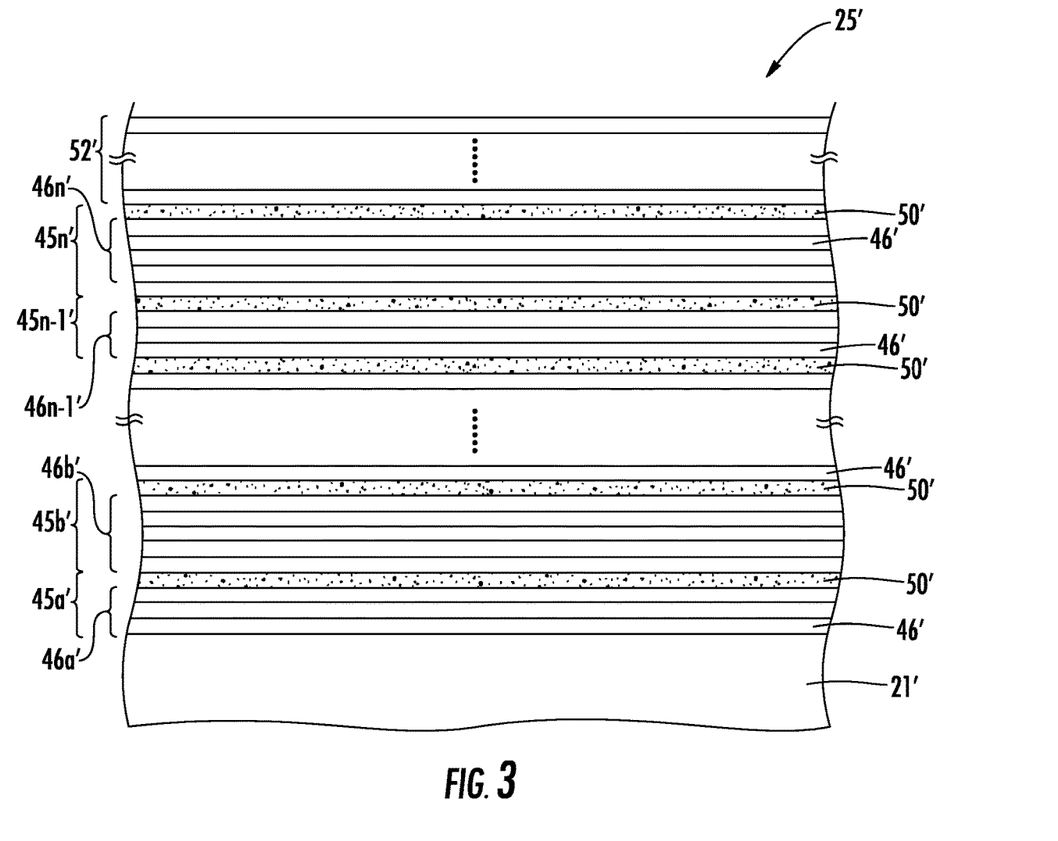
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
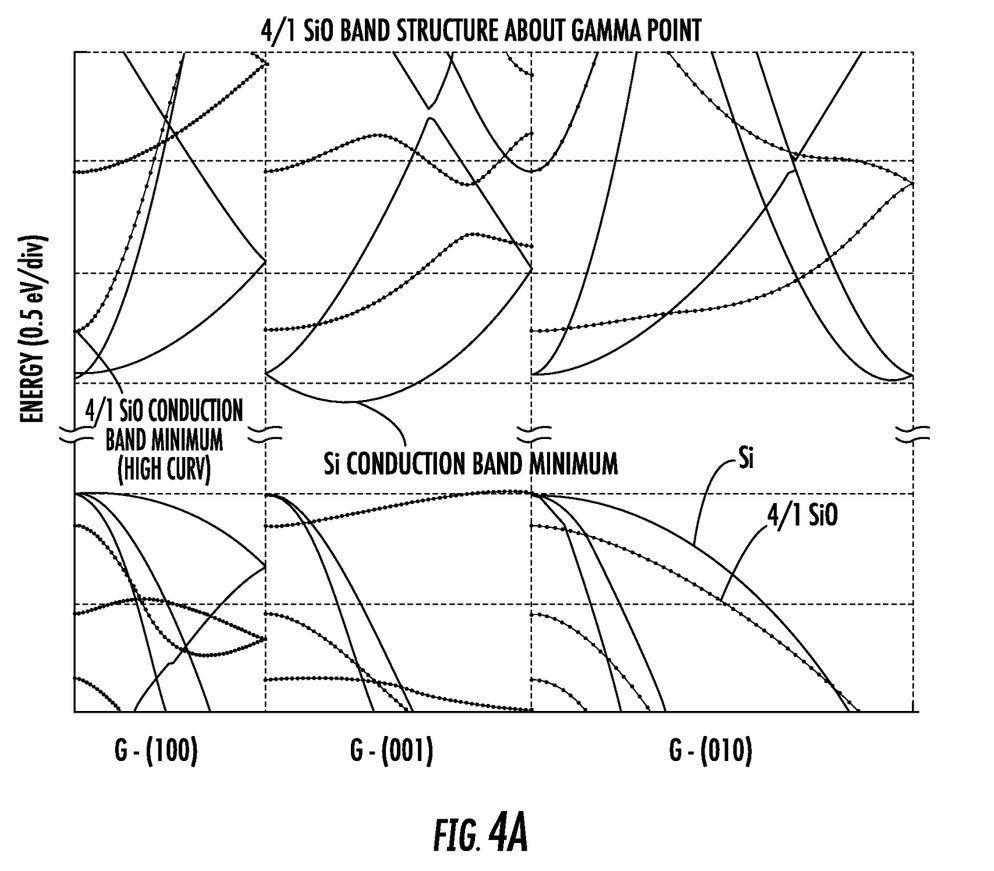
FIG. 4A is a graph of the calculated band structure from the gamma point (G) for both bulk silicon as in the prior art, and for the 4/1 Si/O superlattice as shown in FIGS. 1-2.
Figure 4B:
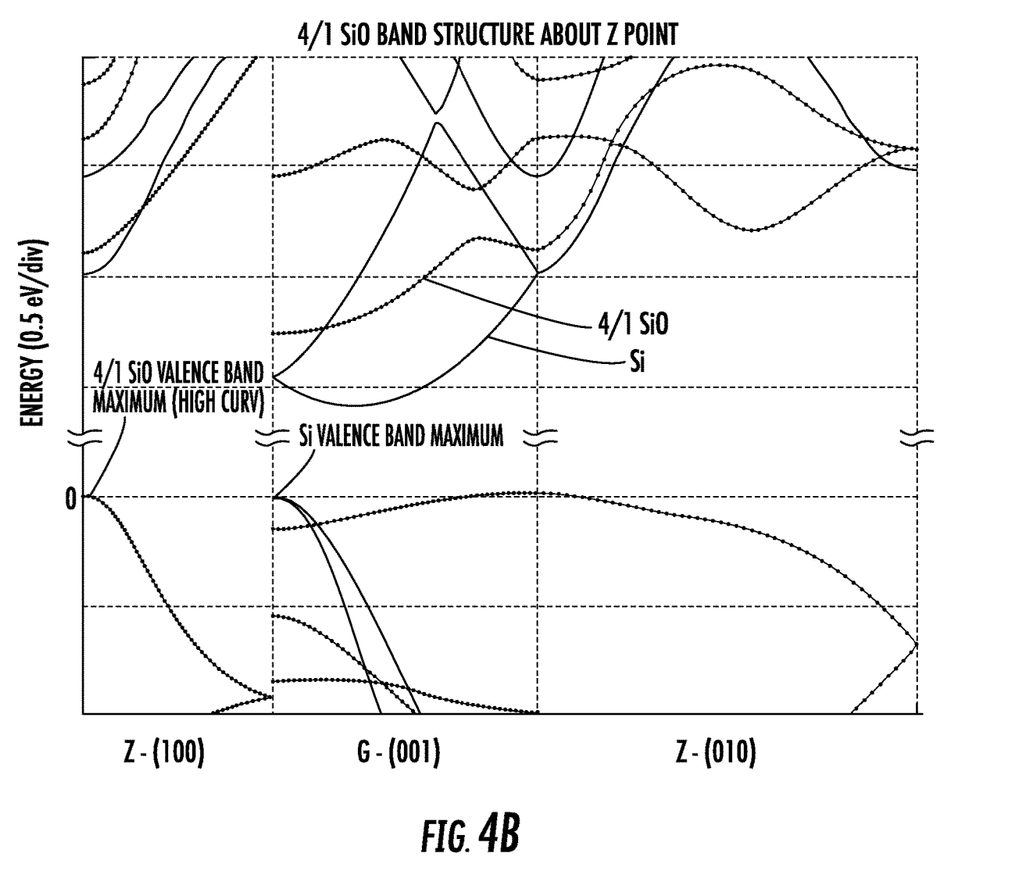
FIG. 4B is a graph of the calculated band structure from the Z point for both bulk silicon as in the prior art, and for the 4/1 Si/O superlattice as shown in FIGS. 1-2.
Figure 4C:
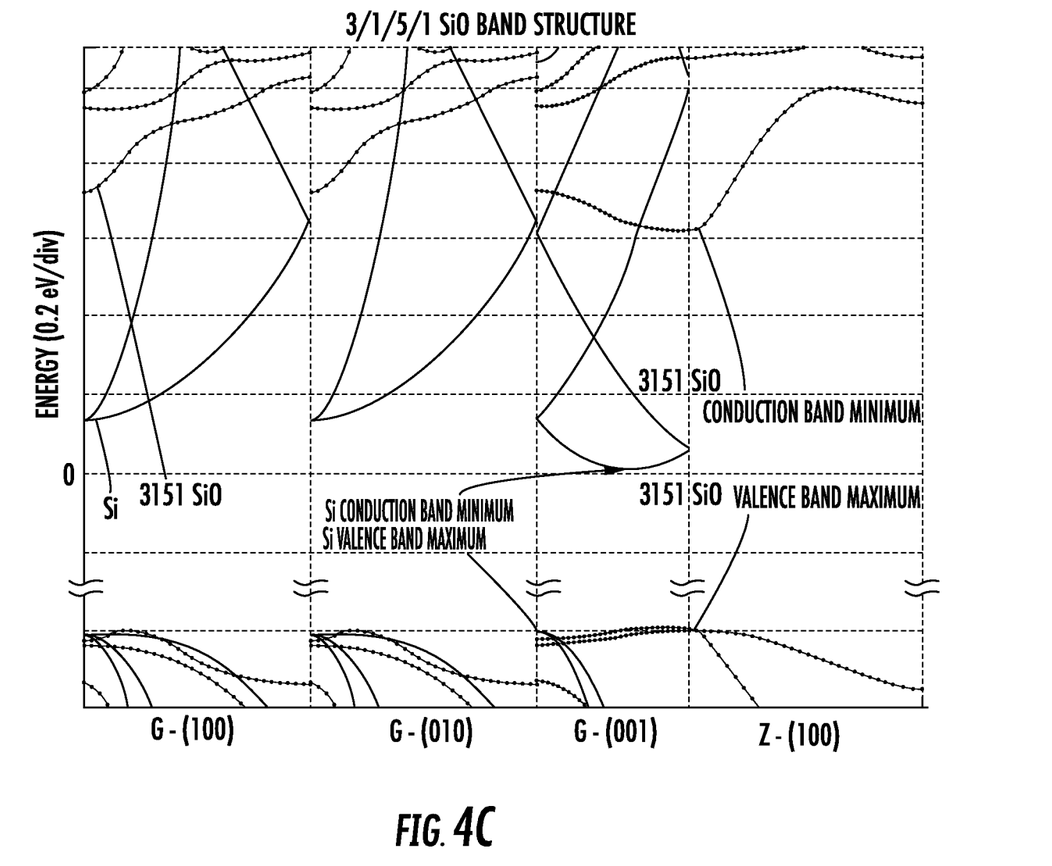
FIG. 4C is a graph of the calculated band structure from both the gamma and Z points for both bulk silicon as in the prior art, and for the 5/1/3/1 Si/O superlattice as shown in FIG. 3.
Figure 5:
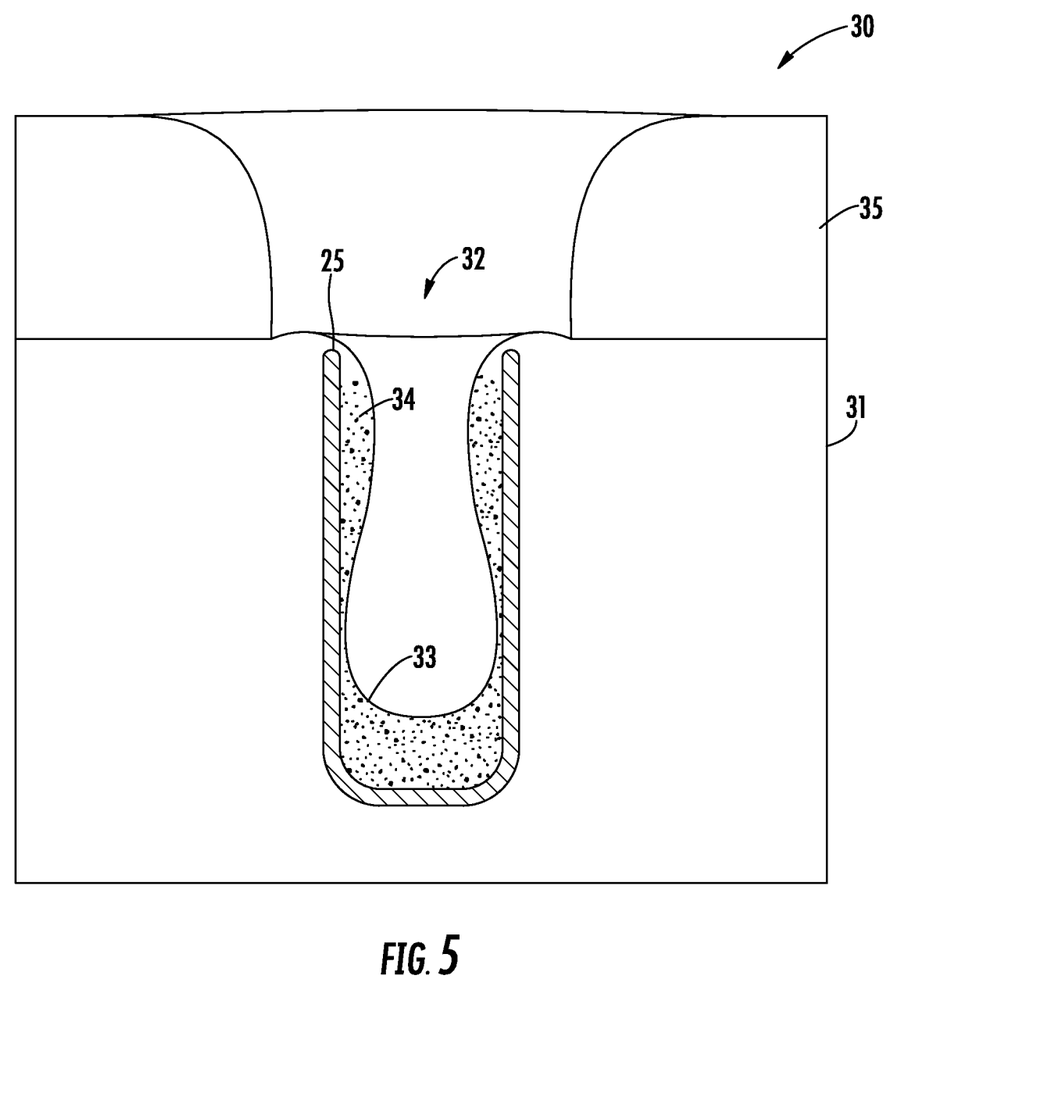
FIGS. 5 and 6 are cross-sectional diagrams illustrating the formation of a trench contact in a semiconductor device including a superlattice trench liner before and after tungsten plug formation, respectively.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 7A:
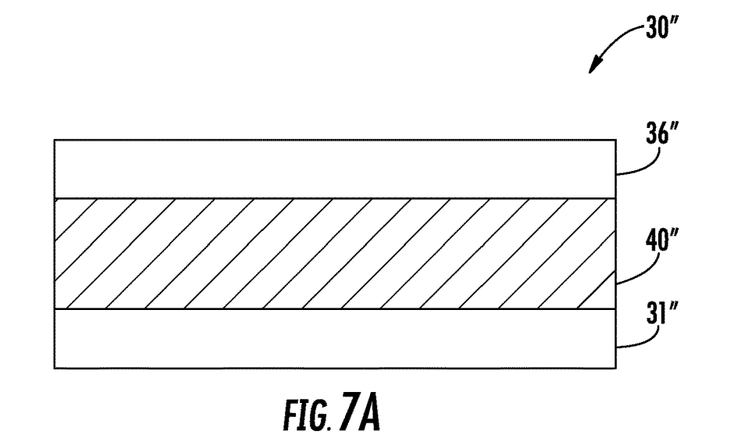
FIGS. 7a-7c are schematic cross-sectional diagrams illustrating a planar source/drain gate contact configuration including a superlattice liner.
Figure 7B:
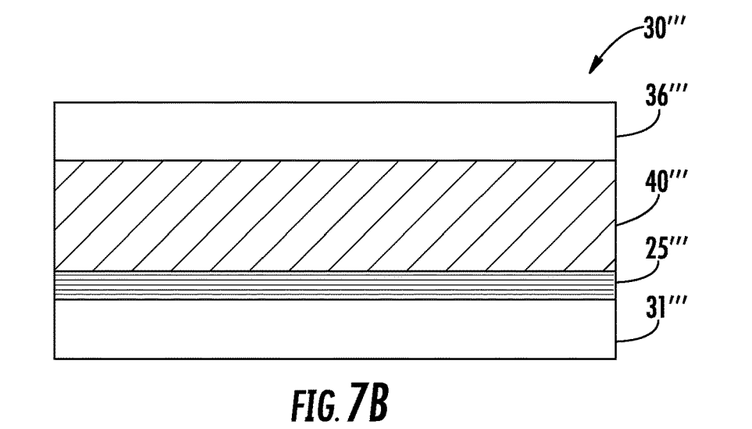
Figure 7C:
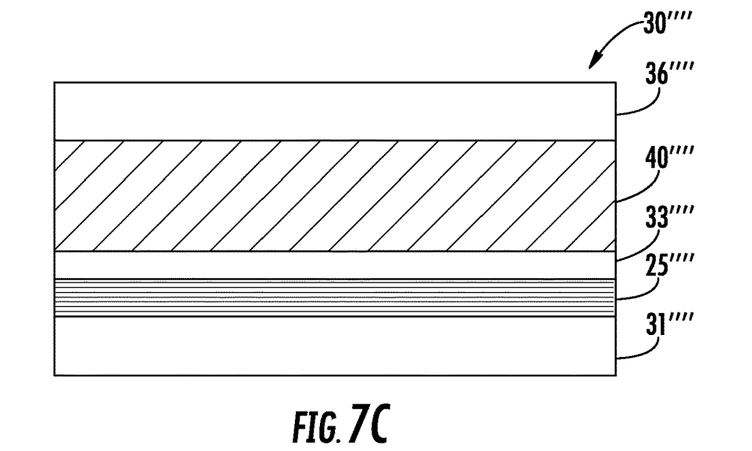
Figure 8:
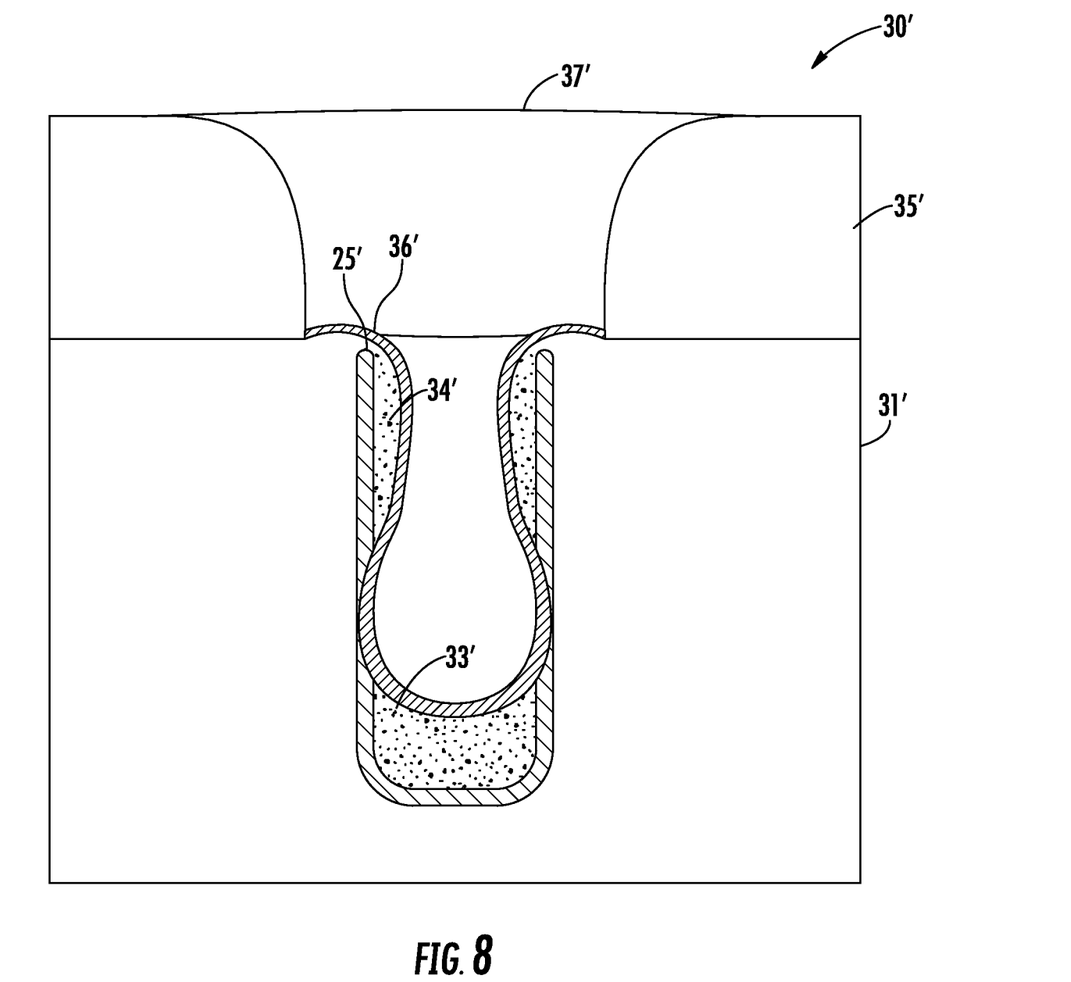
FIG. 8 is a cross-sectional diagram of the trench contact of FIG. 6 in which the superlattice trench liner is partially consumed during the silicidation process.
Figure 9:
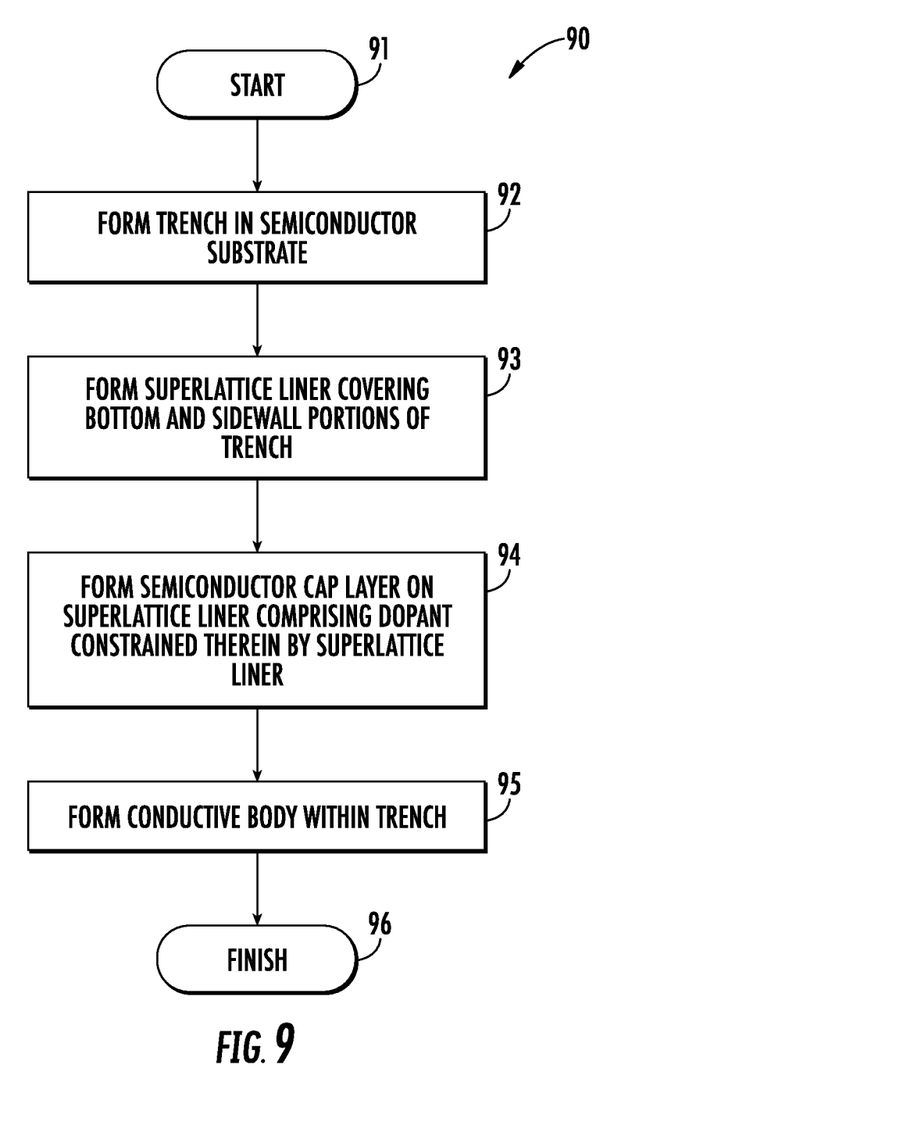
FIG. 9 is a flow diagram illustrating a method of making a semiconductor device in accordance with an example embodiment.

Referring now to FIGS. 5-8 and the flow diagram 90 of FIG. 9, a semiconductor device 30 including a trench contact structure which utilizes an MST film 25 to constrain a contact dopant in the contact region and associated method of fabrication are now described. Beginning at Block 91, in an initial step, a contact trench 32 is formed in a semiconductor substrate 31 (e.g., silicon), at Block 92, with shallow trench isolation (STI) (i.e., oxide) regions 35 on the substrate on opposite sides of the trench. The trench 32 is lined with an MST film 25, at Block 93, such as a Si/O superlattice described above (although other semiconductor/non-semiconductor materials may be used in different embodiments). A semiconductor (here silicon) cap layer 33 is formed on the MST film 25, at Block 94, which is then implanted with a dopant 34 including one or more of boron, arsenic, phosphorus, etc., with a relatively low energy. In accordance with one example implementation, an energy of 10 keV for $BF_2$ is used. However, other implant energies, such as 2-20 keV and species B, BF2, As, and P may also be used, for example. The dopant 34 goes into the cap layer 33 above the MST layer 25, and the MST layer holds or constrains the dopants in place during subsequent thermal steps.

Next, a conductive body is formed in the trench 32 (Block 95). More particularly, the trench 32 may first be lined with a Ti/TiN layer 36, followed by a tungsten (W) fill 37 (i.e., a tungsten plug). The titanium is provided for silicide 40 formation (see FIGS. 7a-7c), and also to act as a barrier layer to reduce or prevent tungsten diffusion and resulting spikes through the junction below. It should be noted that other metals may also be used to form the silicide 40, such as cobalt and nickel, for example. The method of FIG. 9 illustratively concludes at Block 96.

More particularly, the device 30 may be annealed to form the silicide 40. The titanium diffuses into the silicon of the cap layer 33 and may or may not consume the MST layer depending on the silicon cap thickness and amount of deposited Ti/TIN (i.e., the thickness of the metal layer being used). That is, the MST film may be partly or completely sacrificial during silicide formation. An example in which the MST film 25' is partially consumed is shown in FIG. 8 where the other elements are indicated with prime notation and need no further discussion. Clean (i.e., etching) steps after the implant step may be used to reduce the silicon cap 33 thickness as well, if desired.

An example silicide process with respect to titanium will now be described in further detail (the process will differ for other metals, as will be appreciated by those skilled in the art). A metal-rich crystalline phase silicide layer (e.g., $Ti_5Si_4$ or $Ti_5Si_3$) forms between 500 and 550° C., followed by $C_{49}$—$TiSi_2$ between 575 and 600° C. The $C_{49}$—$TiSi_2$ completely consumes the metal-rich silicide before transforming into the low-resistance $C_{54}$—$TiSi_2$ phase at approximately 800° C. Titanium diffuses into silicon and may break through a silicon oxide layer (by reducing the oxide) with the oxygen going interstitial.

The MST layers 25 have interstitial oxygen for the silicidation process for MST, or silicon with a thin native oxide would be equivalent. A thin native oxide would be reduced by titanium and go interstitially into the titanium silicide crystal. This would also be the case for the MST film 25, which starts with the oxygen inside it. Generally speaking, if the cap layer 33 is thicker, the silicide 40 will stop before reaching it. In this case, there would be silicide 40, heavily doped silicon (from the implant), doped MST layer 25 (blocking the dopants), MST layer, and the substrate 31.

Figure 6:
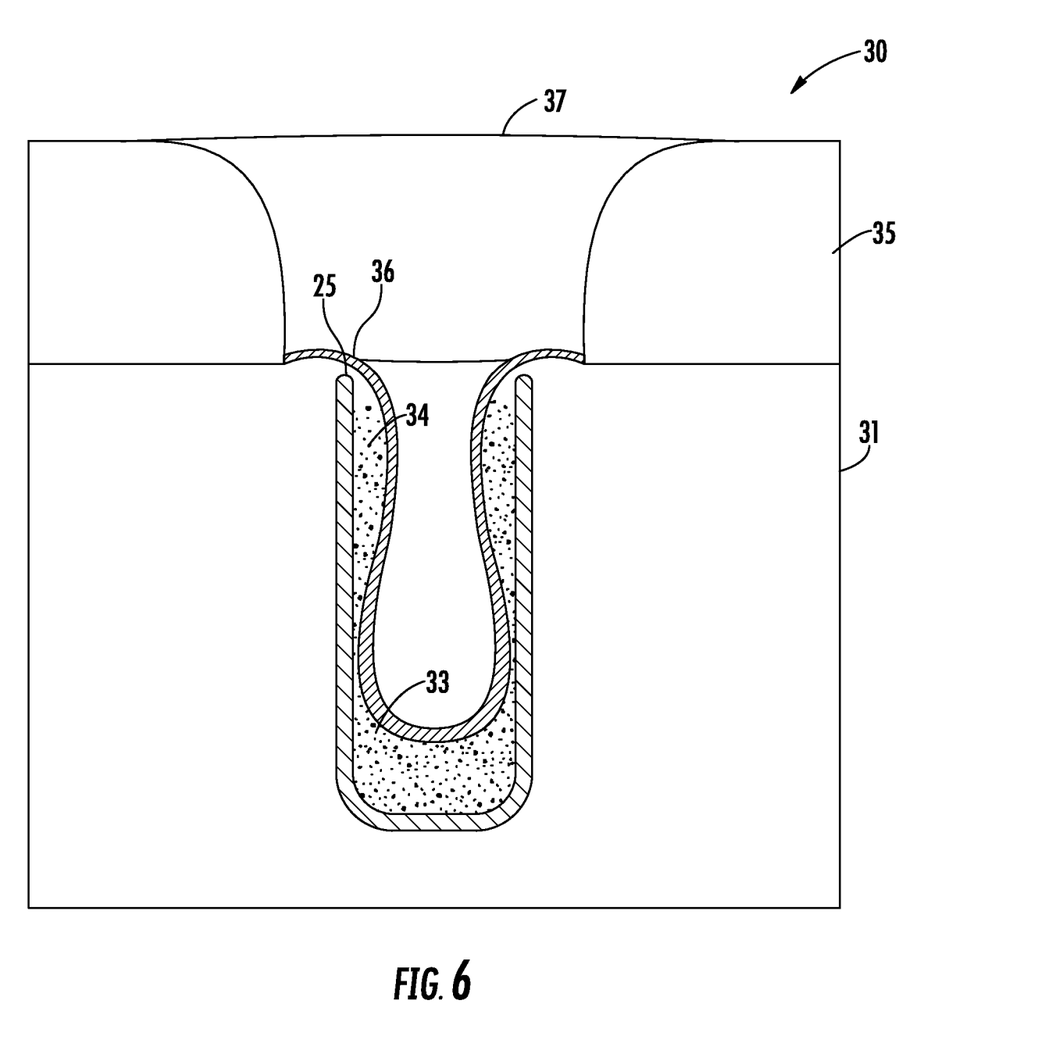

Referring additionally to FIGS. 7a-7c, similar contact structures 30", 30'" and 30"" may be created in planar configurations, as opposed to the vertical trench configuration shown in FIG. 6. By way of example, these configurations may be used for source/drain contacts in planar devices (e.g., MOSFETS). The examples show three different configurations, namely silicide 40" from the barrier layer 36" totally consuming the MST film (FIG. 7a), partially consuming the MST film (FIG. 7b), and stopping before reaching the MST film (FIG. 7c). These three configurations also provide a close up view of how the silicide would appear on the sidewalls and bottom portions of the trench 32 in the vertical embodiment described above, depending upon the degree to which the MST layer 25 is consumed in a given implementation, as will be appreciated by those skilled in the art.

It should also be noted that the MST layers 25", 25'", 25"" may retain higher B (or other contact dopant) dosage and reduce diffusion-limited depth or width (either for planar or 3D contacts) during anneal (i.e., drive in of dopants). Moreover, silicide 40, 40'", 40"" depth may advantageously be chosen to leave untouched, partly remove, or totally remove MST layers 25", 25'", 25"" (subject to implant conditions and silicon thickness above the MST layers) to beneficially leave high B (or other contact dopant) and with reduced diffusion depth/width compared to a baseline (non-MST) case.

Many modifications and other embodiments will come to the mind of one skilled in the art having the benefit of the teachings presented herein. Therefore, it is understood that the disclosure is not to be limited to the specific exemplary embodiments disclosed herein.

That which is claimed is:

1. A semiconductor device comprising:
a semiconductor substrate having a trench therein;
a superlattice liner at least partially covering bottom and sidewall portions of the trench and defining a gap between opposing sidewall portions of the superlattice liner, the superlattice liner comprising a plurality of stacked groups of layers, each group of layers comprising a plurality of stacked base semiconductor monolayers defining a base semiconductor portion, and at least one non-semiconductor monolayer, with each at least one non-semiconductor monolayer of each group of layers being constrained within a crystal lattice of adjacent base semiconductor portions;
a semiconductor cap layer on the superlattice liner and comprising a dopant constrained therein by the superlattice liner; and
a conductive body within the trench.

2. The semiconductor device of claim 1 wherein the conductive body comprises a metal liner adjacent the semiconductor cap layer and comprising a first metal, and a metal body adjacent the metal liner, filling the trench and comprising a second metal.

3. The semiconductor device of claim 2 wherein the conductive body further comprises silicide.

4. The semiconductor device of claim 2 wherein the semiconductor cap layer comprises silicon; and the first metal comprises at least one of titanium, cobalt and nickel.

5. The semiconductor device of claim 4 wherein the second metal comprises tungsten.

6. The semiconductor device of claim 1 wherein the conductive body defines a source/drain contact.

7. The semiconductor device of claim 1 wherein the base semiconductor monolayers comprise silicon.

8. The semiconductor device of claim 1 wherein the at least one non-semiconductor monolayer comprises oxygen.

9. The semiconductor device of claim 1 wherein the dopant comprises at least one of boron, arsenic, and phosphorus.

10. A semiconductor device comprising:
a semiconductor substrate having a trench therein;
a superlattice liner at least partially covering bottom and sidewall portions of the trench, the superlattice liner comprising a plurality of stacked groups of layers, each group of layers comprising a plurality of stacked base semiconductor monolayers defining a base semiconductor portion, and at least one non-semiconductor monolayer, with each at least one non-semiconductor monolayer of each group of layers being constrained within a crystal lattice of adjacent base semiconductor portions;
a semiconductor cap layer on the superlattice liner and comprising a dopant constrained therein by the superlattice liner; and
a conductive body within the trench and comprising
a metal liner adjacent the semiconductor cap layer and comprising titanium, and
a tungsten body adjacent the metal liner and filling the trench.

11. The semiconductor device of claim 10 wherein the conductive body further comprises silicide.

12. The semiconductor device of claim 11 wherein the semiconductor cap layer comprises silicon.

13. The semiconductor device of claim 10 wherein the conductive body defines a source/drain contact.

14. The semiconductor device of claim 10 wherein the base semiconductor monolayers comprise silicon.

15. The semiconductor device of claim 10 wherein the at least one non-semiconductor monolayer comprises oxygen.

16. The semiconductor device of claim 10 wherein the dopant comprises at least one of boron, arsenic, and phosphorus.

17. A semiconductor device comprising:
a semiconductor substrate having a trench therein;
a superlattice liner at least partially covering bottom and sidewall portions of the trench and defining a gap between opposing sidewall portions of the superlattice liner, the superlattice liner comprising a plurality of stacked groups of layers, each group of layers comprising a plurality of stacked base silicon monolayers defining a base silicon portion, and at least one oxygen monolayer, with each at least one non-semiconductor monolayer of each group of layers being constrained within a crystal lattice of adjacent base silicon portions;

a semiconductor cap layer on the superlattice liner and comprising a dopant constrained therein by the superlattice liner; and a conductive body within the trench.

18. The semiconductor device of claim 17 wherein the conductive body comprises a metal liner adjacent the semiconductor cap layer and comprising a first metal, and a metal body adjacent the metal liner, filling the trench and comprising a second metal.

19. The semiconductor device of claim 18 wherein the conductive body further comprises silicide.

20. The semiconductor device of claim 18 wherein the semiconductor cap layer comprises silicon; and the first metal comprises at least one of titanium, cobalt and nickel.

21. The semiconductor device of claim 20 wherein the second metal comprises tungsten.

22. The semiconductor device of claim 17 wherein the conductive body defines a source/drain contact.

23. The semiconductor device of claim 17 wherein the dopant comprises at least one of boron, arsenic, and phosphorus.

24. A semiconductor device comprising:

a semiconductor substrate having a trench therein;

a superlattice liner at least partially covering bottom and sidewall portions of the trench, the superlattice liner comprising a plurality of stacked groups of layers, each group of layers comprising a plurality of stacked base semiconductor monolayers defining a base semiconductor portion, and at least one non-semiconductor monolayer, with each at least one non-semiconductor monolayer of each group of layers being constrained within a crystal lattice of adjacent base semiconductor portions;

a semiconductor cap layer on the superlattice liner and comprising a dopant constrained therein by the superlattice liner; and a conductive body within the trench comprising a metal liner adjacent the semiconductor cap layer and comprising a first metal, and a metal body adjacent the metal liner, filling the trench and comprising a second metal.

25. The semiconductor device of claim 24 wherein the conductive body further comprises silicide.

26. A semiconductor device comprising:

a semiconductor substrate having a trench therein;

a superlattice liner at least partially covering bottom and sidewall portions of the trench, the superlattice liner comprising a plurality of stacked groups of layers, each group of layers comprising a plurality of stacked base semiconductor monolayers defining a base semiconductor portion, and at least one non-semiconductor monolayer, with each at least one non-semiconductor monolayer of each group of layers being constrained within a crystal lattice of adjacent base semiconductor portions;

a semiconductor cap layer on the superlattice liner and comprising a dopant constrained therein by the superlattice liner; and a conductive body within the trench defining a source/drain contact.

27. The semiconductor device of claim 26 wherein the conductive body further comprises silicide.

* * * * *